US009506955B2

(12) United States Patent
Moyer

(10) Patent No.: US 9,506,955 B2
(45) Date of Patent: Nov. 29, 2016

(54) POLARITY SENSING CIRCUIT

(71) Applicant: Apple Inc., Cupertino, CA (US)

(72) Inventor: Todd K. Moyer, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 383 days.

(21) Appl. No.: 13/932,678

(22) Filed: Jul. 1, 2013

(65) Prior Publication Data

US 2015/0002135 A1    Jan. 1, 2015

(51) Int. Cl.
*G01R 19/14* (2006.01)
(52) U.S. Cl.
CPC ..................................... *G01R 19/14* (2013.01)
(58) Field of Classification Search
CPC ...... G01R 19/00; G01R 19/14; G01R 31/06; H02J 7/00; H02J 7/06; H02J 7/0034; H02J 7/0036; H02J 7/0045; H02J 7/0063; H02J 7/0065
See application file for complete search history.

(56) References Cited

U.S. PATENT DOCUMENTS

| | | | |
|---|---|---|---|
| 3,434,034 A | 3/1969 | Garber et al. | |
| 3,700,999 A | 10/1972 | Gource | |
| 3,860,868 A | 1/1975 | Lindell et al. | |
| 4,027,223 A | 5/1977 | Renz | |
| 4,027,240 A | 5/1977 | Meade | |
| 4,319,144 A | 3/1982 | King et al. | |
| 4,423,456 A | 12/1983 | Zaidenweber | |
| 4,473,757 A | 9/1984 | Farago et al. | |
| 4,535,203 A * | 8/1985 | Jenkins et al. | ................. 379/333 |
| 5,508,603 A | 4/1996 | Strong, III | |
| 5,623,550 A | 4/1997 | Killion | |
| 5,940,280 A * | 8/1999 | Murai et al. | ..................... 363/17 |
| 6,023,418 A | 2/2000 | Engira | |
| 6,130,519 A * | 10/2000 | Whiting | ................ H02J 7/0034 |
| | | | 320/105 |
| 6,272,027 B1 * | 8/2001 | Fraidlin et al. | .................. 363/26 |
| 6,738,238 B2 | 5/2004 | Lontka et al. | |
| 7,759,908 B2 | 7/2010 | LeMay et al. | |
| 8,054,049 B1 | 11/2011 | Michaelis | |
| 2003/0048649 A1 | 3/2003 | Lontka et al. | |
| 2007/0170903 A1 | 7/2007 | Apfel | |
| 2008/0157714 A1 | 7/2008 | LeMay et al. | |
| 2011/0125341 A1 * | 5/2011 | Heath | ..................... H02J 1/108 |
| | | | 700/295 |

(Continued)

FOREIGN PATENT DOCUMENTS

| | | |
|---|---|---|
| EP | 2315341 A1 | 4/2011 |
| WO | WO-2007090386 A1 | 8/2007 |

OTHER PUBLICATIONS

PCT Search Report and Written Opinion (dated Nov. 17, 2014), International Application No. PCT/US2014/041519, International Filing Date—Jun. 9, 2014, 10 pages.

(Continued)

*Primary Examiner* — Minh N Tang
*Assistant Examiner* — David Frederiksen
(74) *Attorney, Agent, or Firm* — Blakely, Sokoloff, Taylor & Zafman LLP

(57) ABSTRACT

A dc input circuit receives a dc input voltage. At least four rectification elements are coupled to each other in a diode bridge configuration, where an input of the diode bridge configuration is coupled to the dc input circuit to receive the dc input voltage. At least one of the rectification elements includes a transistor. A decision circuit indicates, as a function of one of collector current and emitter current of the transistor, that the received dc input voltage has normal or reversed polarity. Other embodiments are also described and claimed.

22 Claims, 5 Drawing Sheets

(56) References Cited

U.S. PATENT DOCUMENTS

| | | | |
|---|---|---|---|
| 2012/0314330 A1* | 12/2012 | Norman | H02H 9/004 361/84 |
| 2014/0085948 A1* | 3/2014 | Huynh | H02M 7/219 363/80 |
| 2014/0331066 A1* | 11/2014 | Chiu | G06F 1/266 713/300 |
| 2014/0368155 A1* | 12/2014 | Chen | B60R 16/033 320/104 |

OTHER PUBLICATIONS

International Preliminary Report on Patentability, dated Jan. 14, 2016, Application No. PCT/US2014/041519.

* cited by examiner

POLARITY SENSING CIRCUIT

An embodiment of the invention relates to electronic circuits that can automatically sense the polarity of an input dc voltage, which may be from a source such as a pluggable ac power adapter used to recharge the battery of a portable consumer electronics device. Other embodiments are also described.

BACKGROUND

To allow for greater flexibility and ease of use, portable devices or battery operated consumer electronics devices, such as laptop computers, smartphones, and tablet computers, for example, allow the user to flip an external power source plug. In other words, the polarity of the dc voltage received at the connector of the computer can be reversed. A power manager circuit in the computer can automatically detect the particular polarity and then configure itself accordingly, so that the user need not pay attention or be concerned with the orientation of the plug. The plug may be attached to a battery charging cable that connects the portable device to an external dc power source, such as an ac wall power adapter. The power manager circuit in the computer often has a bridge rectifier circuit having a pair of input terminals that are connected to a dc input circuit and a pair of output terminals that will supply a voltage of known or fixed polarity to a load regardless of the polarity of the input voltage. One of two alternate current paths is automatically enabled, depending upon the polarity of the input voltage When the bridge rectifier is implemented using diodes (a "diode bridge"), relatively large power losses are incurred due to the p-n junction or diode voltage drops that it requires. This is of concern when the dc input source has a lower voltage. For example, if the source is 5 Volts dc, and the diode bridge circuit presents a voltage drop of 0.7 Volts per diode, then 1.4 volts of the total 5 Volts that is available will be lost to the diode bridge, so that the voltage efficiency is a relatively poor (5−1.4)/5=72%. To mitigate this problem, the bridge rectifier may be implemented instead with low loss active devices such as insulated gate field effect transistors that are switched on and switched off to configure or create the correct current path, depending upon instructions received from a separate polarity sensing circuit. The latter senses the polarity of the dc input source, and in response provides the needed control signals to switch on and switch off the correct current path through the field effect transistors that make up the rectifier.

SUMMARY

An embodiment of the invention is a polarity sensing circuit that has a dc input to receive a dc input voltage, and at least four rectification elements coupled to each other in a diode bridge configuration, where an input of the diode bridge configuration is coupled to the dc input to receive the dc input voltage. At least one of the rectification elements has a transistor. A decision circuit indicates, as a function of collector or emitter current of the transistor, that the received dc input voltage has normal or reversed polarity. The transistor may be a bipolar junction transistor, such as an NPN or a PNP device. The transistor may alternatively be a junction field effect transistor or other transistor that has a p-n semiconductor junction that can be used in the rectification element. In this manner, the transistor, can be used to provide a signal that indicates whether or not the transistor is carrying current through its base-emitter or base-collector p-n junction, and this is in turn used by the decision circuit to indicate the polarity of the dc input voltage. Note that the transistor in this case does not receive a control signal at its control electrode (base electrode), since the control electrode is in the active current path of the diode bridge configuration (depending upon the polarity of the input voltage).

In another embodiment, an electronic device, such as a portable consumer electronics device, has a dc input to receive a dc input voltage, a main power supply having a power input coupled to the dc input, and a supporting power supply having at least four rectification elements coupled to each other in a diode bridge configuration. An input of the diode bridge configuration is coupled to the dc input to receive the dc input voltage, and at least one of the rectification elements has a transistor. A decision circuit has an input coupled to either a collector or an emitter of the transistor. The decision circuit indicates polarity of the received dc input voltage to the main power supply, as a function of collector or emitter current of the transistor. The decision circuit may be powered by an output of the diode bridge configured four rectification elements.

In one embodiment, the decision circuit is responsive to the collector or emitter voltage of the transistor, and indicates one polarity when the collector or emitter voltage is high and a different polarity when the collector or emitter voltage is low. In another embodiment, the decision circuit is responsive to the collector or emitter current, and indicates one polarity when the collector or emitter current is high, and a different polarity when the collector or emitter current is low.

In one embodiment, the main power supply has a configurable rectification circuit that uses switched transistors, not diodes, as its rectification elements, for greater power and voltage efficiency. The main power supply is automatically configured for polarity, in accordance with the polarity indication from the decision circuit. As an example, the main power supply may be a much larger power supply than the supporting power supply, for example, one that can provide at least 10 times more output current than an output of the diode bridge configured four rectification elements. The decision circuit may contain hardwired logic circuitry, or it may be part of a programmed microcontroller, that configure current paths through high efficiency power transistors in the higher power rectifier circuit of the main power supply, to use the same dc input voltage. Because the decision circuit can be designed to have very low power consumption, the efficiency loss sustained by using the diode bridge configuration as part of the polarity sensing circuit is not significant.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an"

or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
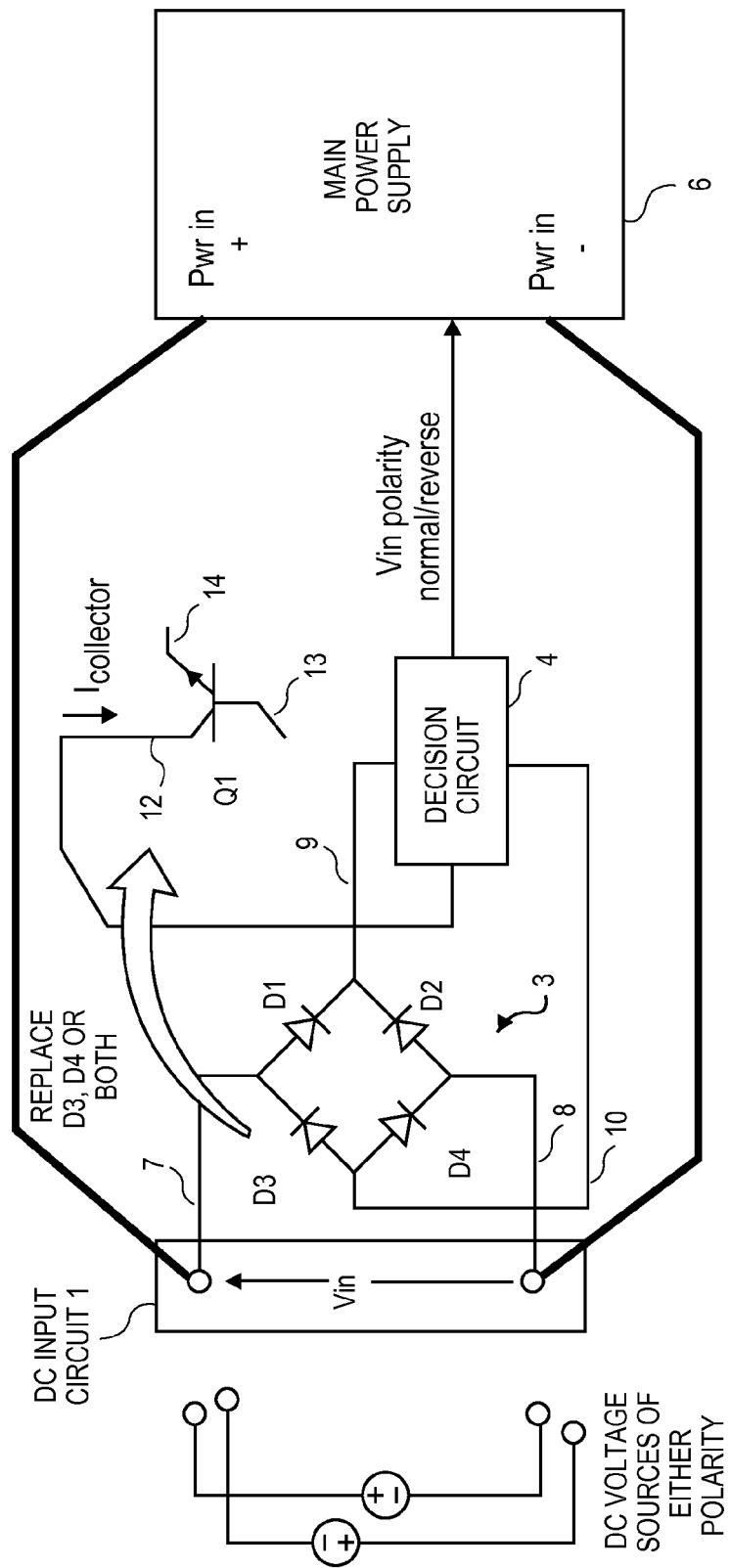
FIG. 1 is a circuit schematic of a polarity sensing circuit.
Figure 2:
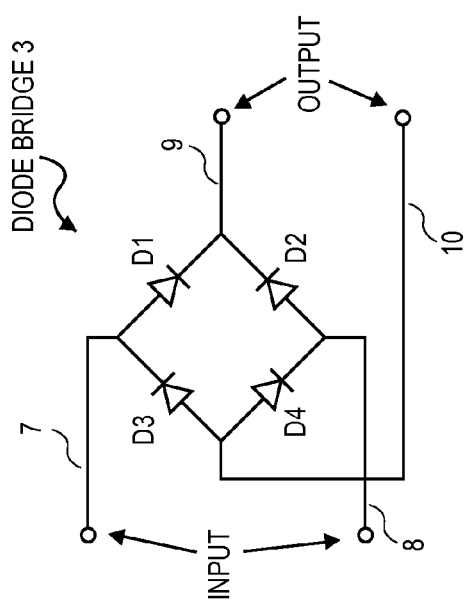
FIG. 2 is a circuit schematic of a diode bridge.

FIG. 1 is a circuit schematic of a polarity sensing circuit in accordance with an embodiment of the invention. A dc input circuit 1 receives a dc input voltage $V_{in}$ that may be defined in the manner shown, namely as an increase in potential from a lower input node 8 to an upper input node 7. Although not shown, the dc input circuit 1 may also include components such as power supply and noise filters and overvoltage protection circuits. The dc input circuit 1 is to be coupled to a dc voltage source of either polarity as shown, for example through an orientation reversal or flip of an external plug or connector of an external power source. The polarity sensing circuit also has at least four rectification elements, D1, D2, D3 and D4, which are coupled to each other in a diode bridge configuration as shown. The diode bridge configuration is also depicted in the circuit schematic of FIG. 2, where a diode bridge 3 has its input terminals labeled as upper and lower input nodes 7, 8 which are to receive a dc input voltage while the output nodes 9, 10 provide a dc output voltage that has fixed polarity regardless of the polarity at the input nodes 7, 8.

Returning to FIG. 1, the diode bridge configuration has an input that is coupled to the dc input circuit 1, for receiving the dc input voltage $V_{in}$. At least one of the rectification elements contains a transistor Q1, which may be viewed as essentially replacing one of the typical rectification elements D1, . . . D4 of the diode bridge 3 (see FIG. 2). In particular, the transistor Q1 has at least three electrodes or terminals, namely a base electrode 13, a collector electrode 12, and an emitter electrode 14. The base electrode 13 and the emitter electrode 14 are replacing the anode and cathode terminals, respectively, of the rectification element D3 or D4. In other words, the base-emitter junction of Q1 becomes the p-n junction of D3 or D4. The collector electrode 12 is coupled to an input of a decision circuit 4. This enables the decision circuit 4 to indicate, as a function of collector current or emitter current of the transistor Q1, that the received dc input voltage $V_{in}$ has normal or reversed polarity. This allows the decision circuit 4 to be responsive to the collector current or collector voltage of the transistor Q1, which as explained above indicates whether or not the base-emitter junction of Q1 is carrying a substantial amount of current.

To further explain, consider the situation where rectification element D3 has been replaced with transistor Q1 so that the base-emitter junction of Q1 is oriented in the same direction as the p-n junction of the element D3. With this choice, it can be seen that there is substantial emitter current when $V_{in}$ has reverse polarity (reverse to the $V_{in}$ arrow shown in FIG. 1). In that situation, the dc input circuit 1 has a voltage such that node 8 becomes positive relative to node 7 which causes the rectification element D2 to be forward biased and hence conduct through the output node 9 and into some load (here the decision circuit 4), and then through node 10, and where the current path continues by forward biasing D3 and then returning through node 7. Since the rectification element D3 will conduct current in that case, replacing D3 with Q1 results in the base-emitter junction of Q1 also being forward biased and conducting current. This in turn increases the collector current through electrode 12. This may then be detected by the decision circuit 4, to indicate reverse polarity in $V_{in}$.

Now, when the dc input circuit 1 has normal polarity, such that node 7 is positive relative to node 8, the following current path is created through the diode bridge 3: node 7 through forward biased rectification element D1 and out through output node 9 and into a load (e.g., decision circuit 4), to node 10 and through forward biased rectification element D4, and then returning to the source through node 8. In other words, rectification element D3 is now a reversed biased p-n junction, so that transistor Q1 in that case also has its base-emitter junction reverse biased. This cuts off the collector current, which is then interpreted by the decision circuit 4 as indicating that $V_{in}$ now has normal polarity.

The decision circuit 4 may use a current-based approach to interpret the collector signal from the transistor Q1. Alternatively, the decision circuit 4 could have a voltage comparator circuit that compares the collector voltage (at terminal 12) to some predetermined threshold voltage. In both instances, the decision logic provides two output states indicating normal and reversed polarity, respectively. In another embodiment, a voltage threshold comparator per se is not needed, for instance, in the embodiment of FIG. 3 described below where there is a second rectification element that has been substituted with a second transistor Q2, thereby yielding a pair of complementary collector signals.

Figure 3:
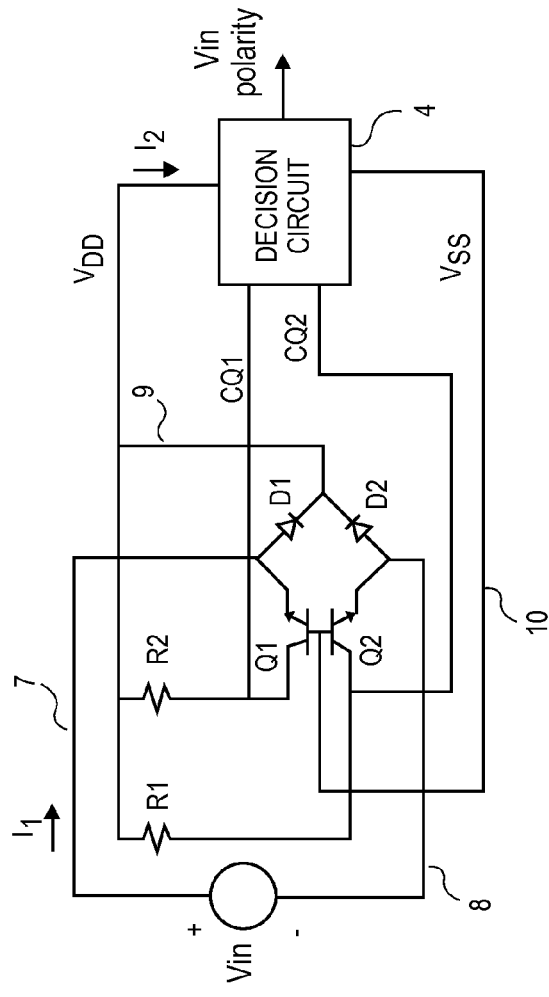
FIG. 3 is a schematic of another embodiment of the polarity sensing circuit.

Referring now to FIG. 3, this is a circuit schematic of another embodiment of the polarity sensing circuit, where instead of one there are two diode rectification elements that have been replaced with transistors Q1, Q2, respectively. In this case, rectification element D3 has been replaced with transistor Q1, and rectification element D4 has been replaced with transistor Q2. In both instances the base-emitter junction of each transistor coincides with or replaces the p-n junction of its rectification element. Operation of the diode bridge 3 in this embodiment is essentially the same as that of FIG. 1 described above, except that a second collector signal is now available (at the collector electrode 12 of Q2), in addition to the signal from the collector electrode 12 of Q1. In this case, the collector signals have been pulled up by their respective resistors R1, R2 to $V_{dd}$ which is supplied at the output node 9 of the diode bridge 3. In this embodiment, the decision circuit 4 may not need any threshold voltage comparator to perform its polarity indication, because instead it could compare the collector voltage CQ1 of Q1 to the collector voltage CQ2 of Q2. This may be viewed as a "differential" or complementary approach for determining the polarity. Alternatively, the decision circuit 4 could compare the collector currents of the two transistors Q1, Q2 to each other using a current-based approach.

Figure 4:
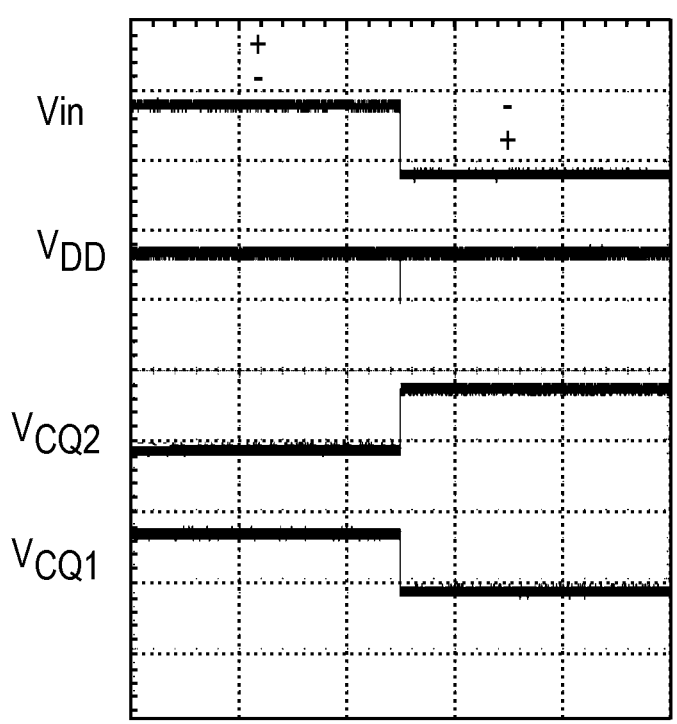
FIG. 4 is a diagram showing voltage states of the polarity sensing circuit in response to changing polarity of the dc input voltage.

Operation of the embodiment of FIG. 3 may be described using the diagram in FIG. 4 which shows the voltage states of the polarity sensing circuit in response to changing polarity of the dc input voltage $V_{in}$. It can be seen that when $V_{in}$ has normal polarity ("high" in this case), the output of the diode bridge 3 is at $V_{dd}$, signifying that the input current I1 into the diode bridge has been converted to provide input current I2 into the decision circuit 4 (and any other suitable load element, not shown). The current path through the diode bridge starts with node 7, forward biased D1, node 9, decision circuit 4 and other load, node 10 at $V_{ss}$, base-emitter junction of transistor Q2, and finally node 8. This means that the base-emitter junction of Q1 is reversed biased such that its collector current is cut off and as a result the collector voltage VCQ1 is pulled up high to Vdd. At the same time, there is current through the base-emitter junction of Q2 which raises its collector current that will in turn lower the collector voltage VCQ2, as shown. Now, if the input voltage $V_{in}$ has reverse polarity, the current path through the diode bridge 3 changes to the following: node 8, D2, node 9, load, node 10, base-emitter junction of Q1, and node 7. Thus, transistor Q1 has substantial collector current, which causes its collector voltage VCQ1 to drop, as shown. As expected, the collector voltage VCQ2 will at the same time rise, because the base-emitter junction of Q2 is now reversed biased and as such its collector current is cut off (thereby raising the collector voltage VCQ2 by virtue of the pull-up resistor $R_2$ to $V_{dd}$). As expected, the voltage at the output node 9 of the diode bridge 3 remains unchanged at $V_{dd}$.

The decision logic 4 contains analog circuitry that performs the needed translation from one or two collector signals, on the collector terminal 12 of one or both transistors Q1, Q2, into a logic value indicating normal or reverse polarity in $V_{in}$. In many instances, it is expected that the decision circuit 4 can be powered by the output node 9 (and return node 10) of the diode bridge 3, as shown in both FIG. 1 and FIG. 3. That is because the output node 9 will provide the same dc output voltage $V_{dd}$ having the same polarity, regardless of the polarity of $V_{in}$.

Returning to FIG. 1, this embodiment of the invention also shows how the decision circuit 4 can be used to signal the control input of a main power supply 6, whose dc power input is also coupled to the dc input circuit 1, a normal or reversed polarity of the input voltage $V_{in}$. In one embodiment, the main power supply 6 may have an active rectifier circuit (not shown) that draws power from the dc input circuit 1, and that is configured with the correct current path, in response to the indication received at its control input, so that it can deliver a fixed polarity dc output voltage. The main power supply 6 may further include, for example, a battery charger circuit that converts power from the active rectifier circuit output to charge a battery that powers a portable consumer electronics device in which the main power supply 6 and the polarity sensing circuit are embedded.

The active rectifier circuit used in the main power supply 6 may rely upon transistor switches, not diodes, as its rectification elements, thereby providing improved power and voltage efficiency. Accordingly, it can be appreciated that the main power supply 6 may use a conventional, voltage and power efficient active or transistor switch-based rectifier to power a large load, while the polarity indication is provided to it by a diode bridge 3 that powers a much smaller load (here, the decision circuit 4 and any other relatively low power consumption circuitry that may be connected to the output node 9). In one embodiment, the main power supply 6 can provide at least ten (10) times more output current than can the diode bridge 3 (as used in the polarity sensing circuit). This, of course, is just an example as the disparity in output power of the main power supply 6 and a "supporting" power supply that is based on the diode bridge 3 (and that provides its output voltage $V_{dd}$ at node 9) may be different. Greater benefits can be had when there is significant disparity in power consumption between the main power supply 6 and the supporting power supply.

It should be noted that while FIG. 3 depicts the embodiment where two rectification elements D1, D2 have been replaced by respective transistors Q1, Q2, the polarity indication may be provided by using only one of the rectification elements that has been replaced with a transistor. The circuit 4 in that case can be responsive to the collector current of that transistor, the polarity would be indicated as normal when the collector current of is high, and reversed when the collector current is low.

Figure 5:
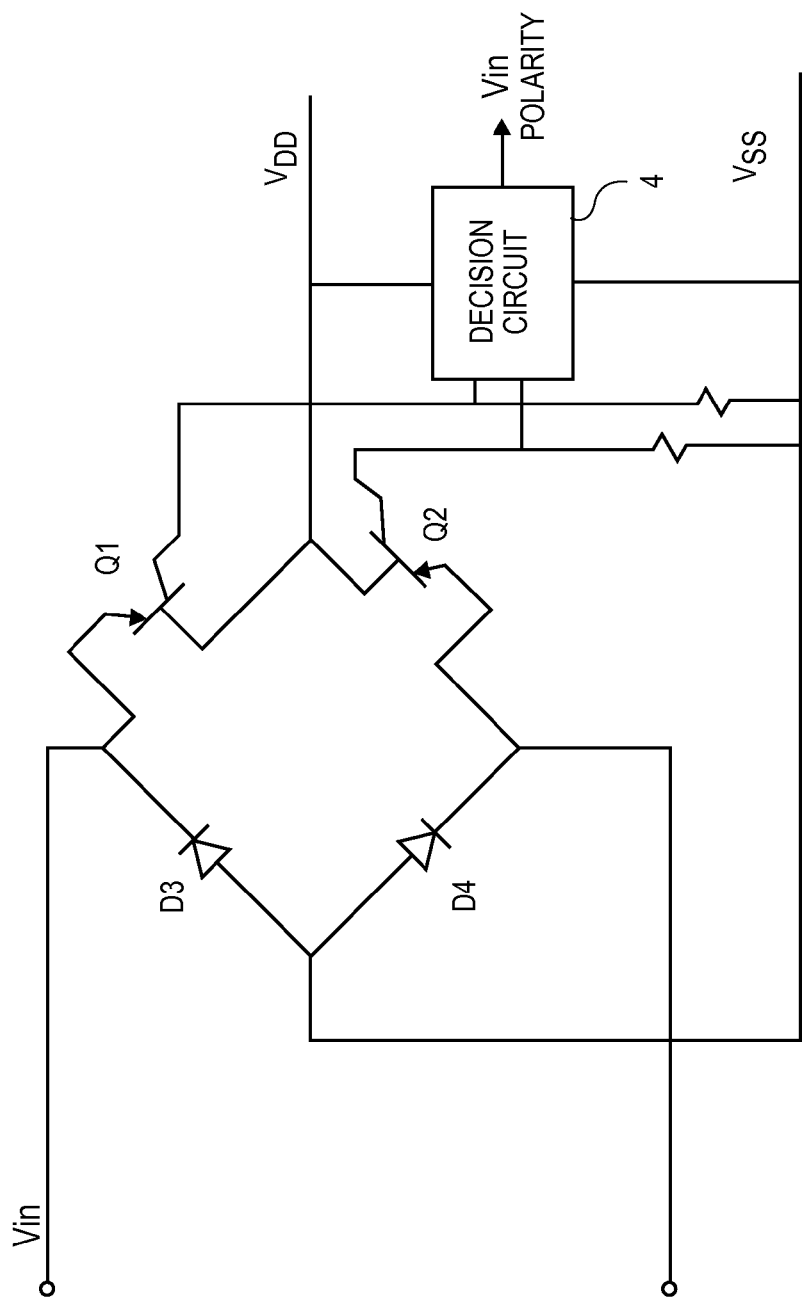
FIG. 5 is a schematic of the polarity sensing circuit in which PNP transistors are used.

The polarity sensing circuit was described above, for example, in connection with FIG. 1 or FIG. 3, as having at least one rectification element D3 or D4 that has been replaced with a transistor Q1 being an NPN bipolar junction transistor (BJT). FIG. 5 shows an alternative to such a scheme, where in this case the rectification elements that have been replaced by transistors are D1, D2 (instead of D3, D4), and also that the transistors Q1, Q2 are PNP devices, rather than NPN devices. The embodiment of FIG. 5 has the emitter-base junction of each PNP transistor coinciding with the p-n junction of the rectification element D1, D2. The collector electrodes of Q1 and Q2 are again coupled to an input of the decision circuit 4, except that in this case the collector electrodes are pulled down to $V_{ss}$ via respective resistors. The same discussion presented above in connection with the design of the decision circuit 4 in the case of NPN transistors is applicable to the embodiment of FIG. 5 in which PNP transistors are used, namely either a current-based approach, a voltage threshold comparison approach or a differential signal approach may be adopted, to distinguish between the state when the base-emitter junction of transistor is conducting or has current, and the state where the base-emitter junction is reverse biased. The waveforms in FIG. 4 also apply to describe the PNP embodiment of FIG. 5, where, for example, when $V_{in}$ has normal polarity, the base-emitter junction of Q1 has current while the base-emitter junction of Q2 is reverse biased, which causes the collector voltage of Q1 to rise above $V_{ss}$, while the collector voltage of Q2 drops to Vss. The decision circuit 4 may be responsive to the collector voltage of the PNP transistors Q1, Q2 such that it indicates a normal polarity when VCQ1 is high, and reverse polarity when VCQ1 is low.

Thus far, the polarity sensing circuit has been described as having a diode bridge 3 in which at least one of the four rectification elements D1, D2, D3, D4 has been replaced with a transistor. In the case of an NPN device (FIG. 3), the base-emitter junction has replaced the p-n junction of the rectification element. In the case of a PNP device (FIG. 5), the emitter-base junction has coincided with the p-n junction of the rectification element. An alternative to these solutions is to connect the transistor Q1, of for example FIG. 3, so that its base-collector junction coincides with or replaces the p-n junction of the rectification element D3 or D4. Similarly, for a PNP solution, the collector-base junction of such a device would coincide with the p-n junction of D1 or D2. In those instances, it is the emitter terminal 14, and not the collector terminal 12, that would be coupled to the input of the decision circuit 4. The decision circuit 4 in those instances would be designed to respond the emitter voltage or emitter current of the transistor when translating a signal that represents whether or not the base-collector junction is forward biased, into a polarity indication for $V_{in}$.

Figure 6:
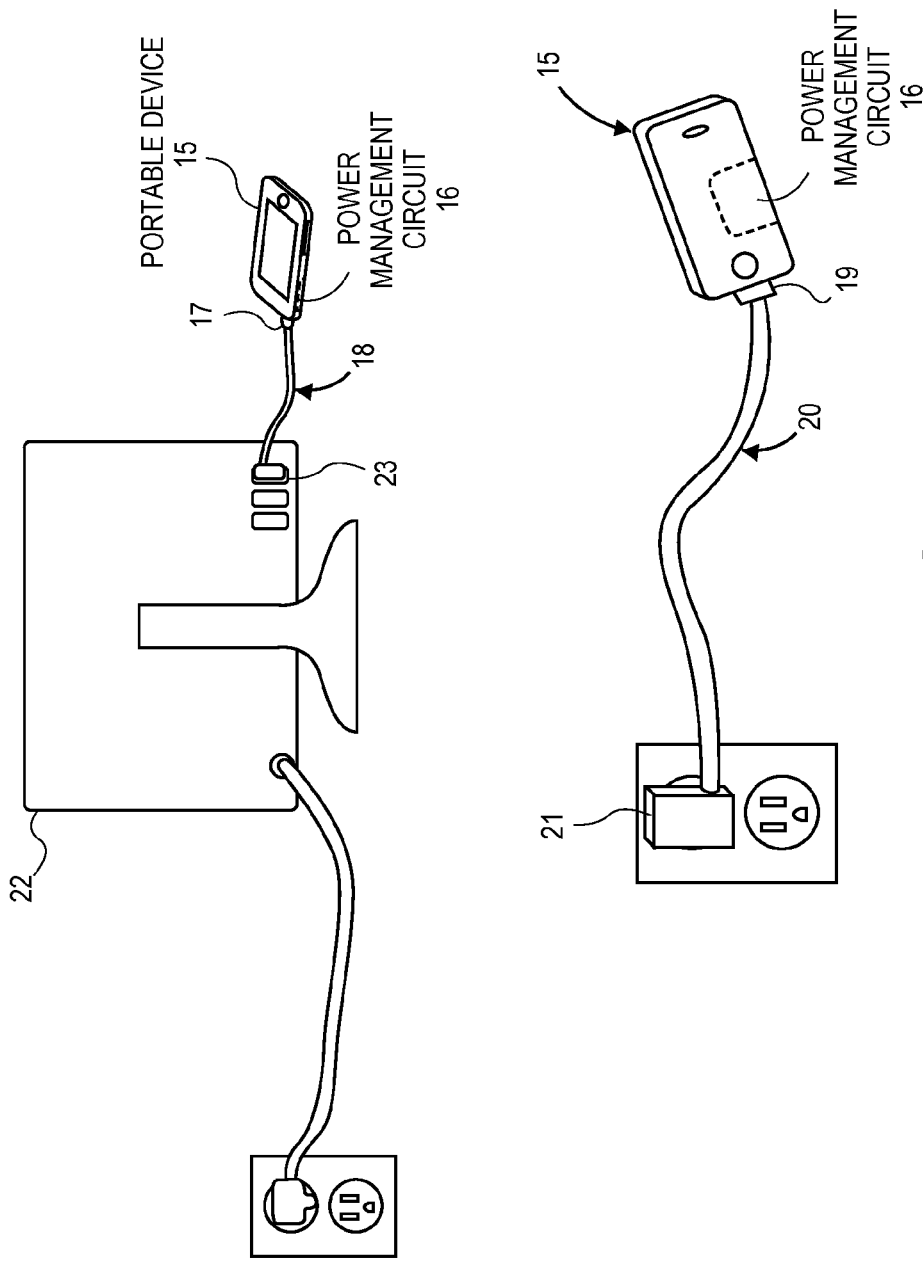
FIG. 6 depicts several examples of consumer electronic devices in which a polarity sensing circuit may be used as part of a power management circuit.

Referring back to the embodiment of FIG. 1, the dc input circuit 1 was described as receiving a dc voltage of either polarity from an external source. In one embodiment, referring now to FIG. 6, the dc input circuit 1 may have a connector that is to connect with a mating connector or plug 17, 19 of an accessory cable or a power cable that brings the dc input voltage from a separate dc power source. For example, the polarity sensing circuit may be part of a power management circuit 16 that is embedded in a portable device 15 such as a tablet computer or a smartphone, as shown in the example of FIG. 6. The dc input circuit 1 would receive, for example, a plug 17 of an accessory cable 18, which has a further connector 23 at its far end that connects with, for example, a universal serial bus (USB) host or other power supplying computer peripheral bus device. In this case, the USB host may be in a desktop computer 22 that is being powered by an ac wall outlet. In another embodiment, the dc input circuit 1 has a connector that is to connect to a mating plug 19 of a power cable 20, which brings the dc input voltage from an ac wall power adapter 21, as also shown in FIG. 6. In yet another embodiment (not shown) the power management circuit 16 is embedded in a laptop computer and where the dc input circuit 1 has a connector that is to connect with a mating plug of a power cable.

Another embodiment of the invention is a method or process being performed within an electronic device, where a dc input voltage is rectified using a circuit in which at least four (4) rectification elements are coupled to each other in a diode bridge configuration. At least one of the rectification elements is a transistor. The method includes indicating polarity of the dc input voltage as a function of collector or emitter current of the transistor. In particular, a base-emitter, emitter-base, base-collector, or collector-base junction of the transistor (depending upon, for example, whether the transistor is an NPN or PNP device) coincides with or replaces the p-n junction of the rectification element. When the rectification element is forward biased, this signifies a particular polarity in the input dc voltage and is indicated by a signal that is available on a third electrode of the transistor, namely a collector signal or an emitter signal. The collector or emitter signal is then translated into a polarity indication. The method may further include configuring a main power supply in accordance with the polarity indication, including configuring an active rectifier circuit of the main power supply to have the correct current path, starting from the same node that has the dc input voltage which feeds the four rectification elements.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the transistor Q1 is depicted in FIG. 1 as being a bipolar junction transistor, it could alternatively be a junction field effect transistor (JFET). When Q1 is a JFET, the references given above to the "collector" current should be understood as referring to the drain current of the JFET, while references to "emitter" current are understood as referring to the source current of the JFET. The description is thus to be regarded as illustrative instead of limiting.

What is claimed is:

1. A polarity sensing circuit comprising:
   a dc input circuit to receive a dc input voltage;
   at least four rectification elements coupled to each other in a diode bridge configuration whose input is coupled to the dc input circuit to receive the dc input voltage, wherein at least one of the rectification elements comprises a transistor with a control electrode in a current path of the diode bridge configuration that conducts a current from the input of the diode bridge configuration through the transistor to an output of the diode bridge configuration; and
   a decision circuit coupled to the transistor, the decision circuit to indicate, as function of the current conducted by the transistor, that the received dc input voltage has normal or reversed polarity.

2. The polarity sensing circuit of claim 1 wherein the transistor is a bipolar junction transistor (BJT) in which the current conducted by the transistor is a collector current.

3. The polarity sensing circuit of claim 2 wherein the transistor is one of an NPN BJT and a PNP BJT.

4. The polarity sensing circuit of claim 1 wherein the transistor is a junction field effect transistor (JFET) in which the current conducted by the transistor is a drain current.

5. The polarity sensing circuit of claim 1 wherein the transistor has at least three electrodes comprising a base electrode, a collector electrode and an emitter electrode, wherein the emitter and the base electrodes are cathode and anode terminals of the rectification element, and the collector electrode is coupled to the decision circuit and the decision circuit is responsive to a collector current of the transistor.

6. The polarity sensing circuit of claim 1 wherein the decision circuit is powered by an output of said four rectification elements in the diode bridge configuration which provides a dc output voltage that has the same polarity regardless of polarity of the dc input voltage.

7. The polarity sensing circuit of claim 6 wherein the dc input circuit comprises a connector configured to connect with a mating connector of one of a power cable and an accessory cable that brings the dc input voltage from a separate dc power source.

8. The polarity sensing circuit of claim 1 in combination with a power supply circuit that has
   a rectifier circuit coupled to draw power from a dc power source, and
   a control input to receive the polarity indication from the decision circuit, wherein the control input is configured to control the rectifier circuit in accordance with the received polarity indication.

9. The polarity sensing circuit and power supply circuit of claim 8 wherein the power supply circuit has a configurable rectification circuit that uses transistor switch rectification elements and that is configured for polarity in accordance with the polarity indication from the decision circuit.

10. The polarity sensing circuit and power supply circuit of claim 8 wherein the power supply circuit is to provide at least ten (10) times more output current than an output of said four rectification elements in the diode bridge configuration.

11. The polarity sensing circuit of claim 1 wherein the dc input circuit comprises a connector configured to connect with a mating connector of a power cable that brings the dc input voltage from a separate dc power source.

12. An electronic device comprising:
a dc input to receive a dc input voltage;
a main power supply having a power input coupled to the dc input;
a supporting power supply having at least four rectification elements coupled to each other in a diode bridge configuration whose input is coupled to the dc input to receive the dc input voltage, wherein at least one of the rectification elements comprises a transistor with a control electrode in a current path of the diode bridge configuration that conducts a current from the input of the diode bridge configuration through the transistor to an output of the diode bridge configuration; and
a decision circuit having a decision input coupled to the transistor and that is to indicate polarity of the received dc input voltage to the main power supply as a function of the current conducted by the transistor in the supporting power supply.

13. The electronic device of claim 12 wherein the decision circuit is powered by an output of said four rectification elements in the diode bridge configuration.

14. The electronic device of claim 12 wherein the main power supply has a configurable rectification circuit that uses transistor switch rectification elements and that is configured for polarity in accordance with the polarity indication from the decision circuit.

15. The electronic device of claim 12 wherein the main power supply is to provide at least ten (10) times more output current than an output of said four rectification elements in the diode bridge configuration.

16. The electronic device of claim 12 wherein the transistor is a bipolar junction transistor (BJT) in which the current conducted by the transistor is a collector current.

17. The electronic device of claim 12 wherein the transistor is a junction field effect transistor (JFET) in which the current conducted by the transistor is a drain current.

18. A method for operating an electronic device, comprising:
rectifying a dc input voltage using a circuit in which at least four rectification elements are coupled to each other in a diode bridge configuration, wherein at least one of the rectification elements is a transistor with a control electrode in a current path of the diode bridge configuration that conducts a current from the input of the diode bridge configuration through the transistor to an output of the diode bridge configuration; and
indicating polarity of the dc input voltage as a function of the current conducted by the transistor.

19. The method of claim 18 further comprising configuring a power supply in accordance with the polarity indication.

20. The method of claim 19 wherein configuring the power supply comprises turning on and off a plurality of transistor switches of an active rectification circuit that is receiving the dc input voltage.

21. The method of claim 18 wherein the transistor is a bipolar junction transistor (BJT) in which the current conducted by the transistor is a collector current.

22. The method of claim 18 wherein the transistor is a junction field effect transistor (JFET) in which the current conducted by the transistor is a drain current.

* * * * *